US006236100B1

(12) United States Patent
Pernyeszi

(10) Patent No.: US 6,236,100 B1
(45) Date of Patent: May 22, 2001

(54) SEMICONDUCTOR WITH HIGH-VOLTAGE COMPONENTS AND LOW-VOLTAGE COMPONENTS ON A SHARED DIE

(75) Inventor: Joseph Pernyeszi, Scotts Valley, CA (US)

(73) Assignee: General Electronics Applications, Inc., Scotts Valley, CA (US)

( * ) Notice: Subject to any disclaimer, the term of this patent is extended or adjusted under 35 U.S.C. 154(b) by 0 days.

(21) Appl. No.: 09/493,955

(22) Filed: Jan. 28, 2000

(51) Int. Cl.$^7$ ............... H01L 21/76; H01L 29/00
(52) U.S. Cl. ............ 257/500; 438/419; 257/490; 257/492
(58) Field of Search ............... 257/499, 500, 257/501, 504, 505, 544, 546, 549, 550, 409, 484, 487, 488, 490, 491, 492, 493, 494, 495, 496; 438/414, 416, 418, 419, 420

(56) References Cited

U.S. PATENT DOCUMENTS

| 4,750,028 | * | 6/1988 | Ludikhuize . |
| 5,077,594 | * | 12/1991 | Clark et al. . |
| 5,187,552 | * | 2/1993 | Hendrickson et al. . |
| 5,279,977 | * | 1/1994 | Kida et al. . |
| 5,350,932 | * | 9/1994 | Malhi . |
| 5,489,799 | * | 2/1996 | Zabrano et al. . |
| 5,712,502 | * | 1/1998 | Mitlehner et al. . |
| 5,742,087 | * | 4/1998 | Lidow et al. . |
| 5,747,853 | * | 5/1998 | So et al. . |
| 5,852,314 | * | 12/1998 | Depetro et al. . |
| 5,861,657 | * | 1/1999 | Ranjan . |
| 5,874,767 | * | 2/1999 | Terashima et al. . |
| 5,889,310 | * | 3/1999 | Terashima et al. . |
| 6,110,804 | * | 8/2000 | Parthasarathy et al. . |
| 6,133,077 | * | 10/2000 | Randazzo . |
| 6,160,290 | * | 12/2000 | Pendharkar et al. . |

* cited by examiner

Primary Examiner—Charles Bowers
Assistant Examiner—Evan Pert
(74) Attorney, Agent, or Firm—Townsend & Townsend and Crew LLP

(57) ABSTRACT

A method and apparatus for increasing a breakdown voltage of a semiconductor device. The semiconductor device is constructed on a semiconductor substrate including an isolation diffusion region around the semiconductor device, a substrate layer, an epi layer on top of the substrate layer, a surface diffusion region extending into the epi layer from a top surface of the epi layer and a metallization line coupled to the surface diffusion, wherein the metallization line traverses the semiconductor device and the isolation diffusion region. The semiconductor device also includes a poly field plate over the isolation diffusion region and beneath the metallization line, a field limiting diffusion region provided in the epi layer between the surface diffusion region and the isolation diffusion region and below the metallization line, and a contact coupled to the field limiting diffusion region, wherein the contact extends to a region below the metallization line and overlapping the poly field plate.

14 Claims, 9 Drawing Sheets

FIG. 6A
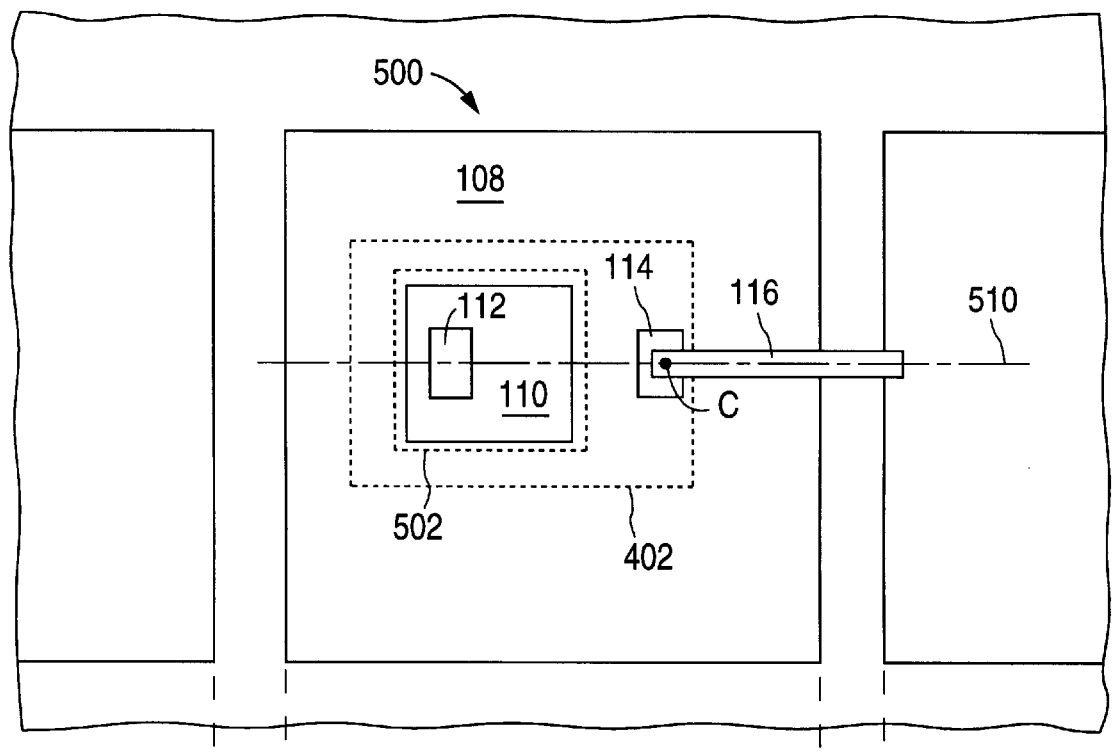
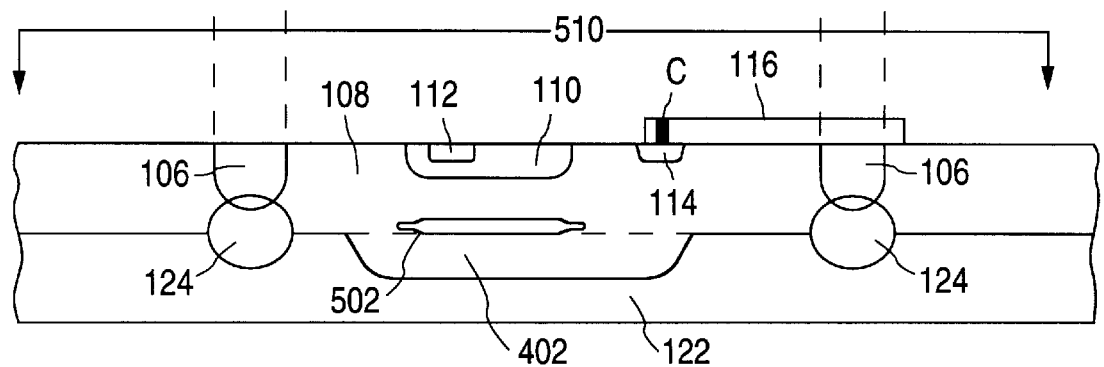
FIG. 6B

SEMICONDUCTOR WITH HIGH-VOLTAGE COMPONENTS AND LOW-VOLTAGE COMPONENTS ON A SHARED DIE

FIELD OF THE INVENTION

The present invention relates to semiconductor devices. More specifically, the present invention relates to high-voltage semiconductor devices and low-voltage semiconductor devices sharing a substrate.

BACKGROUND OF THE INVENTION

Semiconductor process technologies often require a trade-off between density and operating voltages. Circuit elements designed for use at lower voltages (low-voltage elements) can be made smaller and closer together than high-voltage elements. Consequently, low-voltage circuits can be made denser than high-voltage circuits. As a chip's process heretofore determined whether all of the circuitry on the chip was low-voltage or high-voltage, complex analog digital circuits requiring both high-voltage circuitry and low-voltage circuitry were typically divided among two or more chips.

For example, a circuit might require several high-voltage elements for interface circuitry, while low-voltage elements are acceptable for core logic circuitry. Assuming that a high-voltage chip and a low voltage chip are used, interconnections between the chips, typically provided by signal lines on a printed circuit (PC) board onto which the two chips are mounted, connect the high-voltage circuitry and the low-voltage circuitry. With this approach, chip area may be efficiently used at the cost of complicating the circuit assembly process and increasing the size of the PC board. Furthermore, circuit performance will likely be degraded due to the parasitic capacitance of the wiring between the chips.

Several single chip solutions to the above problems have been proposed to combine high-voltage circuits and low-voltage circuits onto a single chip. One such approach is used by International Rectifier to produce a "re-entrant surface field" (RESURF) circuit. In a RESURF circuit having a thin epitaxial (epi) layer, the depletion layer can reach the surface, and thereby limit the electric fields in the device. One such circuit is found in the International Rectifier 2110 chip (IGBT gate driver) that uses low voltage components and a few high voltage components. In this and similar applications, the low voltage circuit density suffers due to the high resistivity of the epi layer necessary to make the high voltage devices. The RESURF principle improves this problem somewhat, since the epi layer is relatively thin and can be more heavily doped to provide lower resistivity than it would be without RESURF.

Another problem with a chip that has high voltage devices and low voltage devices is crossover. The crossover problem occurs when high voltage signals are routed across a device, thereby producing large electric fields that may cause the device to breakdown. The following description and accompanying figures demonstrate the problems created by crossover.

FIG. 1A shows a top view of a portion of a typical semiconductor 100 that includes a number of devices, for example, device 102 and device 104. Devices 102 and 104 may be transistor devices or other semiconductor devices. The devices are separated by an isolation diffusion region 106, which is typically a p-type region.

FIG. 1B shows an enlarged top view of the devices 102 and 104 surrounded by the isolation diffusion (iso) region 106. The device 102 includes an n-type epitaxial (epi) region 108, a p-type base region 110, a first n+ region 112 and a second n+ region 114. The device 102 also includes a metal line 116 which is coupled to the second n+ region 114 at point C. If device 102 were a transistor, the base region 110 could be a transistor base, the first n+ region 112 could be an emitter and the second n+ region 114 could be a collector. Additional metal lines may be coupled to the base 110 and emitter 112 at points B and E, respectively.

FIG. 1C shows a cross-sectional view 120 of the device 102 taken at a location indicated by line 130. The cross-sectional view 120 shows semiconductor layers that make up the device 102. From the cross-sectional view 120 is it possible to see that the device 102 includes a p-type substrate layer 122 and a p+ type bottom isolation diffusion region 124. Also visible in the cross-sectional view 120 is an oxide layer 126 that isolates the metal line 116 from the surface of the semiconductor.

The problem of crossover can be seen in FIG. 1C. For example, when high voltages are present on the metal line 116, high electric fields are generated that can cause the device 102 to break down near the junction of the epi 108 and iso region 106 indicated at location 128.

FIGS. 2A and 2B show one technique that has been used to try to solve the crossover problem. FIG. 2A shows an enlarged top view of a region of device 102 that includes the metal line 116 as depicted in FIG. 1B. The region 128 shows where breakdown can occur when high voltages are present on the metal line 116 which crosses over the iso region 106 surrounding the device 102.

FIG. 2B shows the enlarged top view of FIG. 2A and includes poly regions used to try to prevent breakdown due to high voltage on the crossing metal line 116. A series of poly regions are inserted between the metal line 116 and the semiconductor epi region 108. The poly regions include poly1 regions shown at 202, 204 and 206. The poly regions also include poly2 regions shown at 208 and 210. The poly1 and poly2 regions are positioned in the third dimension such that they are able to be overlapped. The poly regions are shown having different sizes to distinguish between poly1 and poly2 regions. In practice the poly1 and poly2 regions may be the same or different sizes.

FIG. 3 shows an enlarged cross-sectional view of the semiconductor device 102 taken at a location indicated by line 220. In the cross-sectional view, a depth dimension of the overlapping poly1 and poly2 regions is visible. The poly regions are separated by oxide layers shown at 302. The poly1 region 202 is coupled to the collector 114 by electrode 304 and the poly1 region 206 is couple to the isolation region 106 by the electrode 306.

The poly regions form a crossover of connections from the electrode 304 to the electrode 306 in a process referred to as a double poly process. In the double poly process, a capacitive voltage divider is formed utilizing the overlap of the poly1 and poly2 materials as a series of capacitors as shown at 309. For example, the overlap of the poly1 204/oxide/poly2 210 materials, as shown at 310, forms one of the capacitors. The voltage divider effect of the overlapping poly materials helps to prevent large fields from being generated by the high voltage on the metal line 116, and thus, causing device breakdown at the region indicated by 128.

While this method works for signals with short periods, it becomes unreliable for long duration signals or at high temperatures where oxide conduction will modify the voltage on the individual plates of the capacitors. This occurs because the oxide is not a perfect insulator and it conducts slightly. Conduction in the oxide is dependent on its composition (it is not a pure silicon dioxide) and the environmental conditions (moisture). However slight this conduction may be, eventually (after some time in DC conditions) the voltages at the capacitors will be determined by the oxide conduction. The oxide may be thought of as a resistor having a very high resistance value. As a result of oxide conduction, large voltages may appear at one or more of the capacitors and thereby cause large electric fields which may result in device breakdown.

SUMMARY OF THE INVENTION

The present invention includes a method and apparatus for increasing device breakdown voltage and thereby allowing fabrication of high voltage and low voltage circuitry on a single chip.

In one embodiment of the present invention, a semiconductor device is provided. The semiconductor device is constructed on a semiconductor substrate including an isolation diffusion region around the semiconductor device, a substrate layer, an epi layer on top of the substrate layer, a surface diffusion region extending into the epi layer from a top surface of the epi layer and a metallization line coupled to the surface diffusion, wherein the metallization line traverses the semiconductor device and the isolation diffusion region. The semiconductor device also includes a poly field plate over the isolation diffusion region and beneath the metallization line, a field limiting diffusion region provided in the epi layer between the surface diffusion region and the isolation diffusion region and below the metallization line, and a contact coupled to the field limiting diffusion region, wherein the contact extends to a region below the metallization line and overlapping the poly field plate.

A further understanding of the nature and the advantages of the inventions disclosed herein may be realized by reference to the remaining portions of the specification and the attached drawings.

BRIEF DESCRIPTION OF THE DRAWINGS

FIG. 6A shows a top view of a device constructed in accordance with the present invention having an extended epi region and a buried field layer;

FIG. 6B shows a cross-sectional view the device of FIG. 6A;

DESCRIPTION OF THE PREFERRED EMBODIMENTS

Employing a process according to the present invention, high-voltage circuit elements can be fabricated on a semiconductor substrate using a process designed for low-voltage circuit elements. As a result, the high-voltage elements and the low-voltage elements can be fabricated on a single semiconductor chip, allowing for efficient use of chip area for the low-voltage elements while providing higher breakdown voltages for the high-voltage elements. In addition, surface field rings can be used to prevent breakdown due to high voltage signal crossover.

In the description below, exemplary device dimensions are provided. It will be apparent to one with skill in the art that device dimensions may vary due to the size of the device or the breakdown voltage requirements. Therefore, the dimensions provided are intended to be merely exemplary and not limiting of the scope of the invention. In some drawings, device regions are shown as being square or rectangular. However, other geometries may be used, such as for example, circular or oval regions.

More circuitry can fit into a limited chip area if the transistors can be made smaller. Reduction in the size of bipolar or diffused metal oxide semiconductor (DMOS) transistors is often limited by the epi layer thickness requirements and/or the isolation regions necessary around the transistors or groups of transistors. In the attempt to increase circuit density, epi layer thickness is minimized, but it cannot be reduced too much or else the component breakdown voltage requirements cannot be met, since the depletion layer width for the desired breakdown voltage must be accommodated by the epi layer thickness.

The breakdown voltage is limited by three interdependent phenomena, namely, the epi-substrate breakdown, epi-iso breakdown, and epi-base (bipolar) or epi-body (DMOS) breakdown. Each of these needs to be improved for a higher breakdown voltage device. One way to obtain a higher breakdown voltage device is to thicken the epi layer and more lightly dope it locally, where the higher voltage device is to be built. This can be accomplished by selective epi growth (SEG) or by diffusing a fast diffusing dopant into a lighter doped substrate to sufficiently extend the epi layer. The latter method is less expensive and can be done without disturbing the rest of the original process. This can be very important because all of the components built in the original process can be built in the modified process and all the models still apply (with the exception of the substrate capacitance, which is lower, and a definite advantage).

Figure 4A:
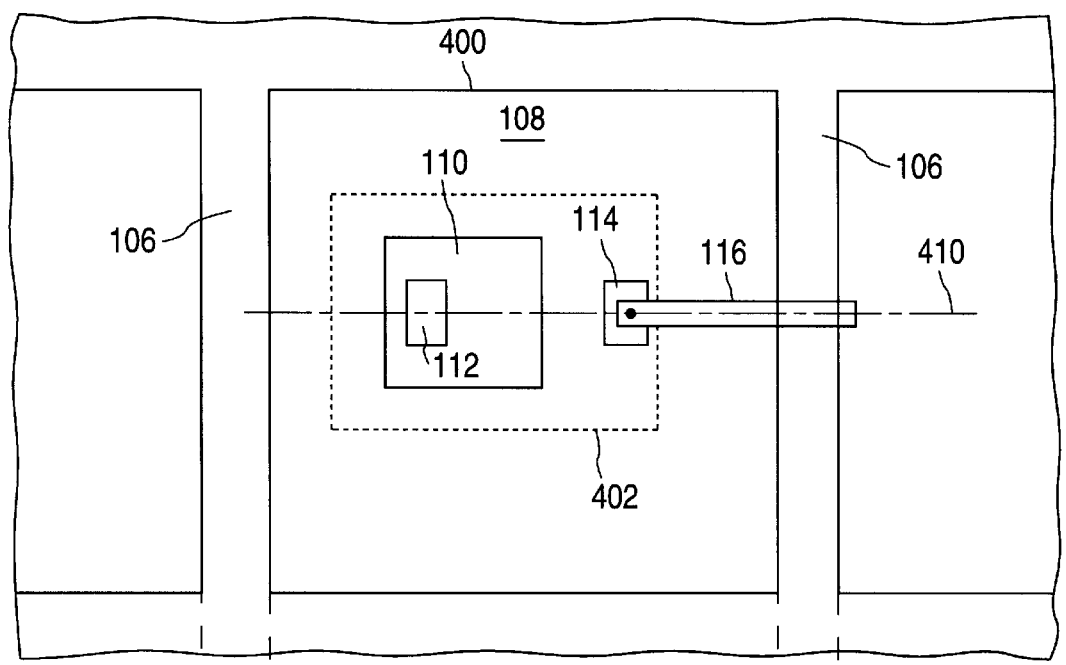
FIG. 4A shows a top view of a device having an extended epi region in accordance with the present invention.

FIG. 4A shows a top view of a device 400 having an extended epi region 402 in accordance with the present invention.

Figure 4B:
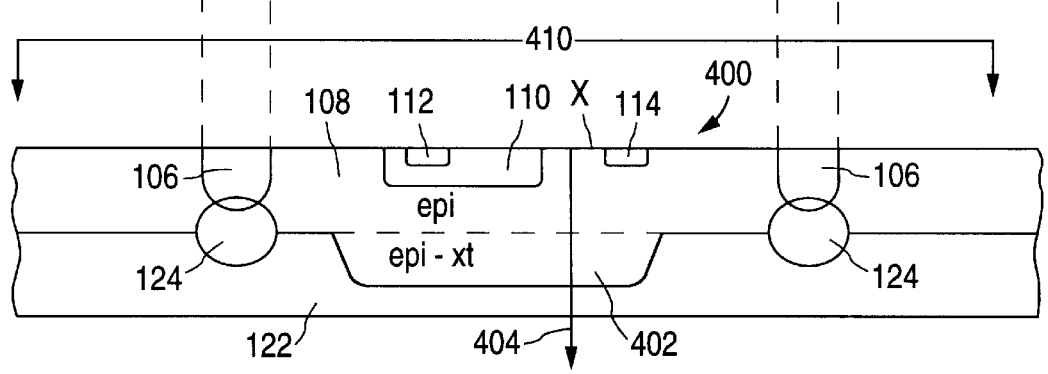
FIG. 4B shows a cross-sectional view of the device of FIG. 4A.

FIG. 4B shows a cross-sectional view of the device 400 taken at a location indicated by line 410. The device 400 includes the n-type epi layer 108, the p-type substrate layer 122 and the n-type epi extension (xt) layer 402. The n-type epi xt layer 402 may be formed by diffusing a fast diffusing dopant into the lighter doped substrate. This allows selected portions of the device to have thicker epi regions. The surface of the device 400 is indicated by X and a vertical distance indicator from the surface X is shown at 404. For purposes of clarity, the metal line 116 is not shown in FIG. 4B.

Figure 5:
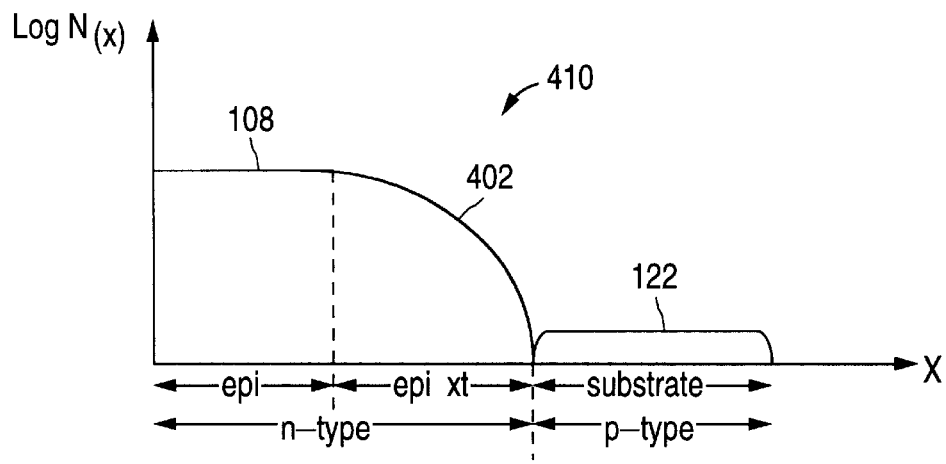
FIG. 5 shows a dopant profile of the device of FIG. 4A.

FIG. 5 shows a dopant profile 410 of the device 400, wherein the epi 108 doping concentration, the epi xt 402 doping concentration and substrate 122 doping concentration are plotted against the vertical distance (indicated by indicator 404) from the surface "X." The log N(x) represents the doping concentration in each portion of the silicon.

First Exemplary Device

In a semiconductor designed for low voltage devices, the original epi resistivity cannot support voltages in excess of the originally designed breakdown value for a junction formed by diffusion from the surface of the epi. In order to increase the breakdown voltage for the "surface" junction, the RESURF principle may be combined with an extended epi region and used in conjunction with a buried field limiting layer of the opposite conductivity type as the epi. This process is illustrated by FIGS. 6A, 6B and 7.

FIG. 6A shows a top view of a device 500 constructed in accordance with the present invention and capable of supporting large breakdown voltages. The device 500 includes the epi layer 108, the n-type collector (or drain) region 114 coupled to the metal line 116 and the n-type epi xt diffusion layer 402. The device 500 also includes the p-type surface diffusion 110 and a p-type buried field limiting layer 502.

FIG. 6B shows a cross-sectional view of the device 500 taken at a location indicated by line 510. The p-type buried field limiting layer 502 is shown located below the surface diffusion 110 at the boundary of the epi 108 and the epi xt region 402. In one embodiment, the buried field limiting layer 502 is in the approximate range of 1–12 microns in thickness and is at least as wide as the surface diffusion 110. However, depending on the dimensions of the device, one skilled would be able to determine suitable dimensions for the buried field layer 502. The depth of the epi extension region 402 is also dependent on device dimension and one skilled in the art could determine the most suitable thickness.

Figure 7:
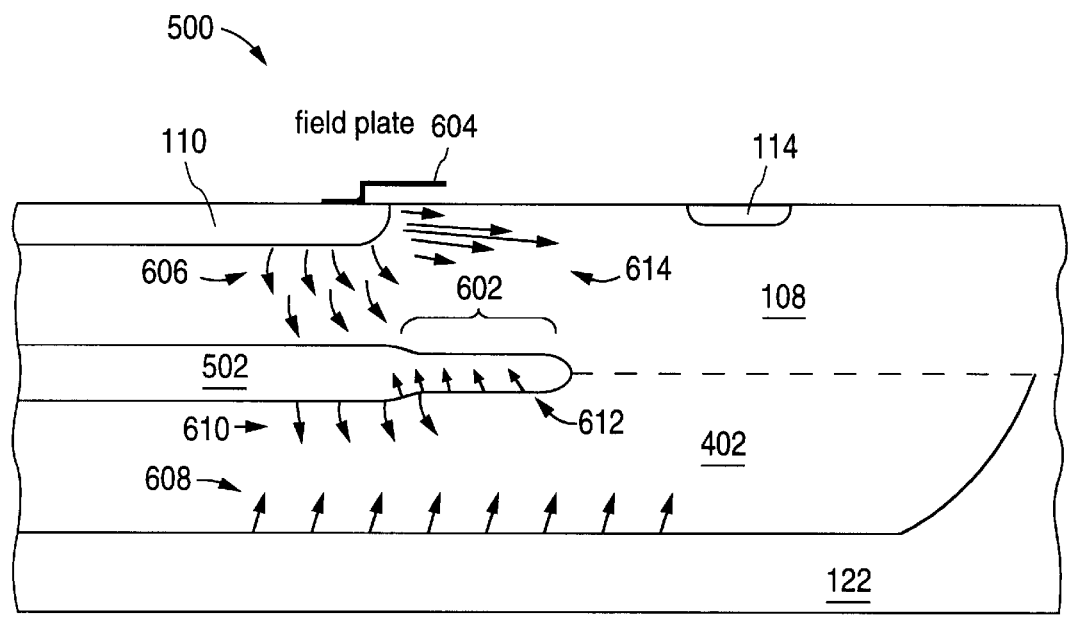
FIG. 7 shows an enlargement of the device in FIG. 6B wherein depletion fields are defined.

FIG. 7 shows an enlargement of the cross-sectional view of FIG. 6B. In the enlarged view of FIG. 7, it can be seen that the buried field limiting layer 502 includes a tail segment 602. In one embodiment the tail segment 602, is approximately 1–5 microns thick and 2–30 microns in length. However, one skilled in the art could determine suitable dimensions based on the dimensions of the overall device. The surface diffusion 110 can form the base of an NPN transistor or the body of a DMOS transistor. The total dopant charge in the buried field limiting layer 502 can be controlled by mask averaging. In semiconductor processing, the mask will have an array of small openings (dots) through which (after the pattern has been transferred to the photoresist coating on the wafer) dopant is implanted (ion implantation) into the silicon. After diffusion, the dopant is spread and the dots meld together. The amount of dopant in an area sufficiently larger than the size of the mask opening, on the average, will be the implant flux (ions per square inch) multiplied by the mask area ratio. If the mask looks like a chessboard, the average will be half of what it would be if the opening were contiguous.

Prior to describing the operation of the device 500, it will be assumed that the surface diffusion layer 110 and the substrate layer 122 are biased to zero volts. It will also be assumed that the collector region 114 is bias to a positive voltage and the buried field limiting layer 502 is floating. As the voltage on collector region 114 is increased, a depletion layer spreads from the junction of the surface diffusion layer 110 and the epi layer 108, as shown at 606. A depletion layer also spreads from the junction of the epi xt layer 402 and the substrate layer 122, as shown at 608. At the junction of the surface diffusion layer 110 and the epi layer 108, the depletion layer spreads more into the epi layer 108 due to its lighter doping. The potential on the buried field limiting layer 502 is the same as on the collector region 114 until the depletion layer from the junction of the surface diffusion layer 110 and the epi layer 108 reaches the top of the buried field limiting layer 502. After this point, the voltage on the buried field limiting layer 502 becomes fixed with respect to the surface diffusion layer 110.

Further increase of the voltage at collector region 114 will cause the depletion layer to spread from the junction of the buried field limiting layer 502 and the epi xt diffusion layer 402 at shown at 610. Since tail section 602 is relatively lightly doped, the depletion layer also spreads into the buried field limiting layer 502 as shown at 612. With further increases of the bias on collector region 114, the tail section 602 completely depletes. Eventually, the epi xt diffusion layer 402 also completely depletes. This however, happens as the result of the bias at collector region 114. The electric field remains low enough in the epi xt diffusion layer 402 that no current is induced between the buried field limiting layer 502 and the substrate 122. The charge (doping) in the tail section 602 is designed such that its depletion approximately coincides with the depletion of the epi 108 region above the tail section 602, as shown at 614. This is the RESURF technique to create a wide depletion region next to the surface diffusion layer 110 so that the electric field in this region remains low enough to prevent breakdown at the junction between the surface diffusion layer 110 and the epi layer 108. A short field plate 604 may also be employed at the surface diffusion layer 110 to prevent premature breakdown before the epi 108 is fully depleted above the tail section 602. The field plate helps to extend the depletion region in the epi 108 layer.

Therefore, the above described embodiment demonstrates how the epi xt layer and the buried field limiting layer can be used to increase the breakdown voltage of a device, even though the device is located on a semiconductor fabricated with a thin epi region intended to form low voltage components.

Second Exemplary Device

In a second exemplary device, a further improvement for constructing high voltage devices in accordance with the invention is provided. The improvement addresses the fact that a connection to the high voltage device may be made using standard IC metallization, and as a result, the problems associated with crossover may occur. During operation of the device, the metal lines that connect to the high voltage device and cross the iso diffusion regions 106 may carry signals at various potentials ranging from zero to the maximum voltage for the high-voltage device. As previously discussed, the problem of crossover may cause the device to breakdown at the junction of the epi layer and the iso diffusion region.

Figure 8:
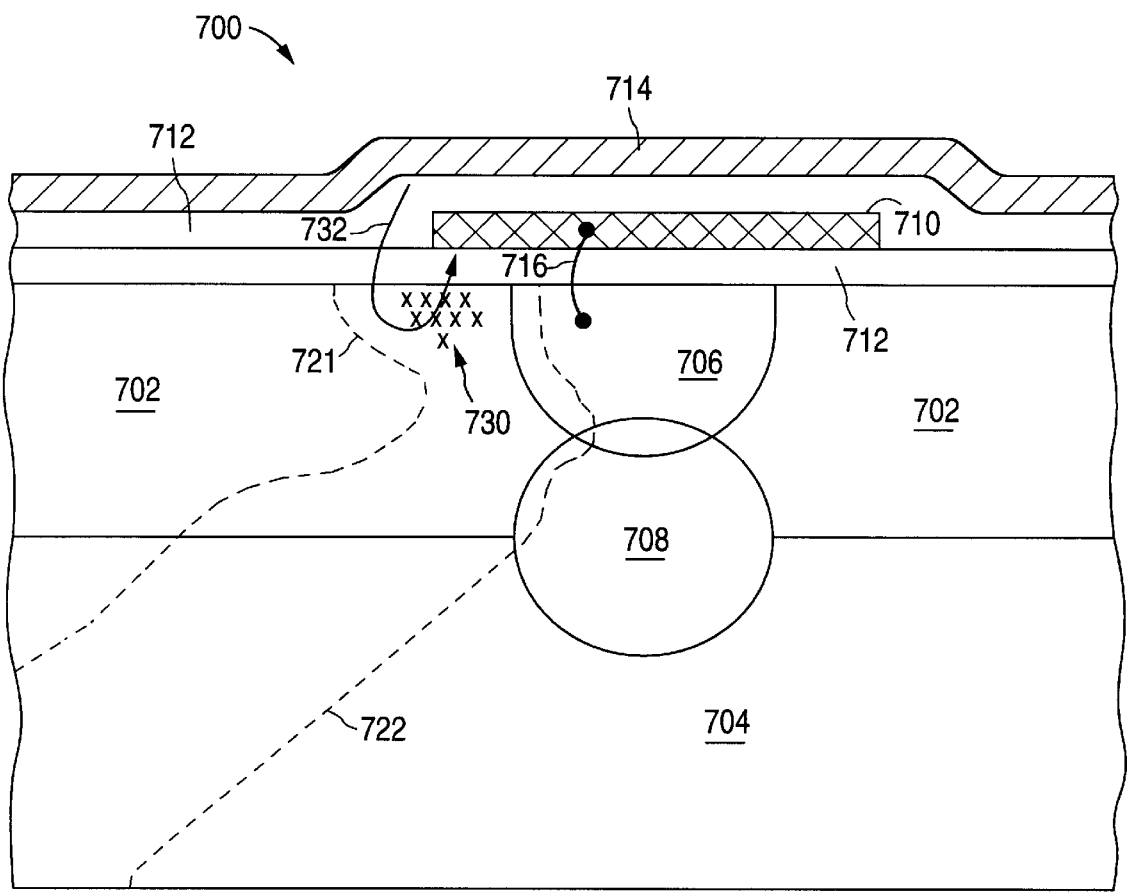
FIG. 8 shows a typical device having a poly plate covering an iso diffusion region.

FIG. 8 shows a device 700 constructed using a typical technique in an attempt to deter the effects of crossover. The device 700 includes an n-type epi layer 702, a p-type substrate layer 704, a top p+ type iso diffusion region 706, a bottom p+ type iso diffusion region 708, a poly shield 710, an oxide layer 712 shown as two sections and a metal line 714. The poly shield 710 is coupled to the top iso diffusion region 706 via electrode 716.

During operation of the device 700 the epi 702 near the top iso diffusion region 706 is depleted by the top iso diffusion region 706 and the grounded poly shield 710. Dotted line 721 depicts the depletion layer edge in the n-type layer and dotted line 722 depicts the depletion layer edge in the p-type layers. Since the potential on the metal electrode 714 is the same as the epi 702 potential, a depletion layer will not form due to the electrode 714. In fact the depletion layer formed by the poly shield 710 at its edge will be suppressed some by the electrode 714. Since the depletion layer is narrower with, than without, the presence of electrode 714, the electric field is higher and this causes premature breakdown at the edge of the poly shield 710, as shown at 730. This is caused by electric field lines starting on the metal electrode 714 just above the depletion layer edge 721, penetrating the oxide layers and the top of the epi 702, then curving to the right (still in the epi), then turning upward through the oxide and ending on the poly field plate 710, at and near the poly field plate's left edge, as shown at 732. At some fairly high voltage the electric field is strong enough to cause carrier multiplication which sustains itself. A portion of the generated carriers are collected by the epi/iso junction and appear as current between the epi 702 and the iso diffusion 706. Therefore, use of the poly plate 710 alone does little to increase the device breakdown voltage.

Figure 9A:
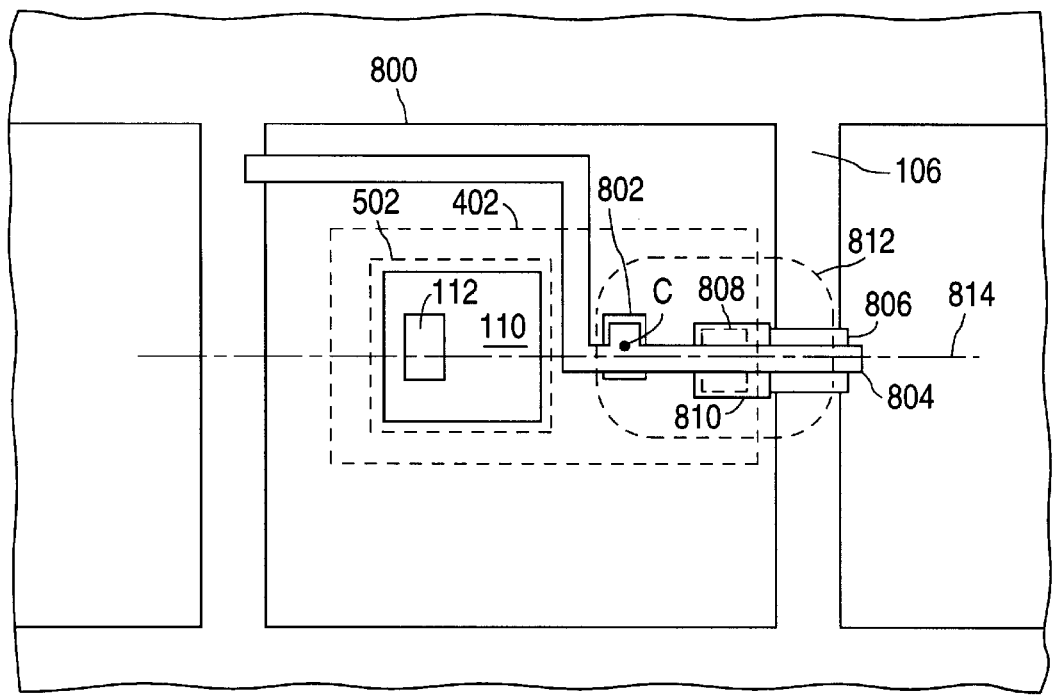
FIG. 9A shows a top view of a device having a surface field limiting ring in accordance with the present invention.

FIG. 9A shows a top view of a device 800 constructed in accordance with the present invention. The device 800 includes the epi xt region 402, the buried field limiting layer 502, the emitter region 112 and the base region 110. The device 800 also includes a metal contact 802 which is coupled to the collector region 110. For clarity purposes, the collector region 808 is not shown in FIG. 9A but will be shown in subsequent figures. The metal contact 802 couples to a metal line 804 at point C. The metal line 804 may carry high voltage signals to and from the device 800 while traversing the iso diffusion region 106.

The device 800 also includes a poly shield plate 806 which is located between the metal line 804 and the iso diffusion 106. Located below the metal line 804 is a surface field limiting region 808 coupled to a metal plate 810. The metal plate 810 overlaps the poly field plate 806.

The improvement of the surface field limiting region 808 coupled to the metal plate and overlapping the poly plate will allow high voltages to be present on the metal line 804 without causing breakdown of the device 800. A detailed description of the operation of the device 800, and in particular, the operation of the portion of the device 800 shown at 812 will follow.

Figure 9B:
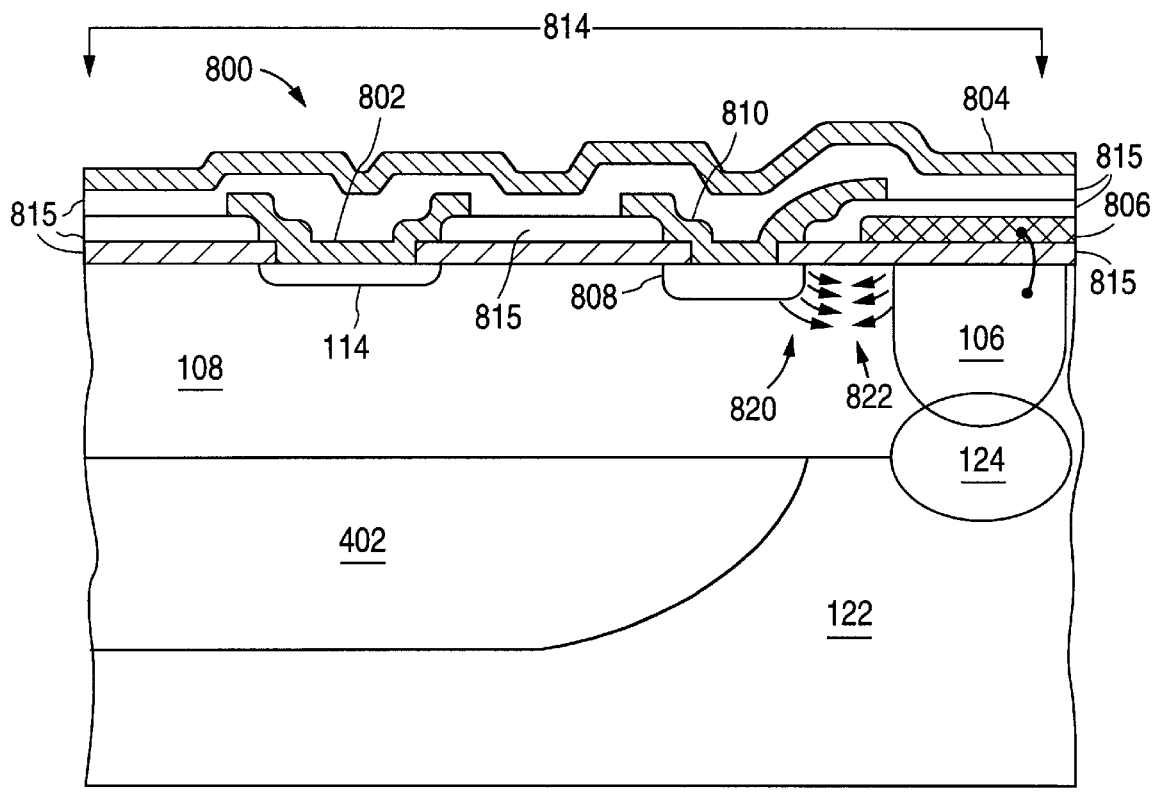
FIG. 9B shows a cross-sectional view the device of FIG. 9A.

FIG. 9B shows an enlarged cross-sectional view of the portion of the device 800 shown at 812, wherein the cross-section is taken at a location indicated by line 814.

The cross-sectional view of the device 800 includes the epi layer 108, the n-type collector (or drain) region 114, the p-type substrate 122, and the n-type epi xt diffusion layer 402. The device 800 of FIG. 9B also includes the ring diffusion 808, the poly field plate 806, the p+ type top iso diffusion 106, the p+ type bottom iso diffusion 124, the metal line 804, the metal contact 802 and the metal plate 810. Also shown in FIG. 9B are oxide layers 815 which are used to construct the device 800 in a layered fashion and to insulate conductive elements from direct contact with each other.

The collector (or drain) electrode is the metal contact 802 which is coupled to the collector region 114. The metal contact 802 is connected to the crossing metal line 804 at the contact point C, which is located in the third dimension and not visible in the cross-sectional view of FIG. 9B. The crossing metal line 804 may have voltage levels ranging from zero to the maximum allowed voltage for the device.

The iso diffusion 106 has the poly field plate 806 over it and extending over the edge of the iso diffusion 106. In most applications, this distance is approximately 3–8 microns. This shields the iso diffusion 106 from fields that may be generated by the crossing metal 804.

The surface diffusion 808 is a p-type field limiting ring whose potential stays constant with respect to the iso diffusion 106 beyond a certain epi voltage. This potential is determined by punch through between the iso diffusion 106 and the surface diffusion 808. Punch through occurs when depletion regions from two junctions (in this case the ring 808/epi 108 junction and iso 106/epi 108 junction) touch each other. For example, a depletion region extending from the ring 808/epi 108 junction is shown at 820 and a depletion region extending from the iso 106/epi 108 junction is shown at 822. In punch through, the two depletion regions (820, 822) touch each other allowing current to flow from one layer to the other (ring to iso) by means of majority carriers (in this case holes since the regions are p-type). The magnitude of the current is proportional to the potential difference beyond the punch through potential. This keeps fields induced by the high voltage on the metal line 804 low, because the potential difference between the metal line 804 and the metal contact 810 is smaller than the difference between the metal line 804 and the poly plate 806. The high electric field is generated when metal line 804 is at high-voltage together with the epi layer 108. If the field between metal line 804 and the edge of the metal contact 810 connected to the field limiting ring diffusion 808 is too high, then a second field limiting ring can be used.

Figure 10:
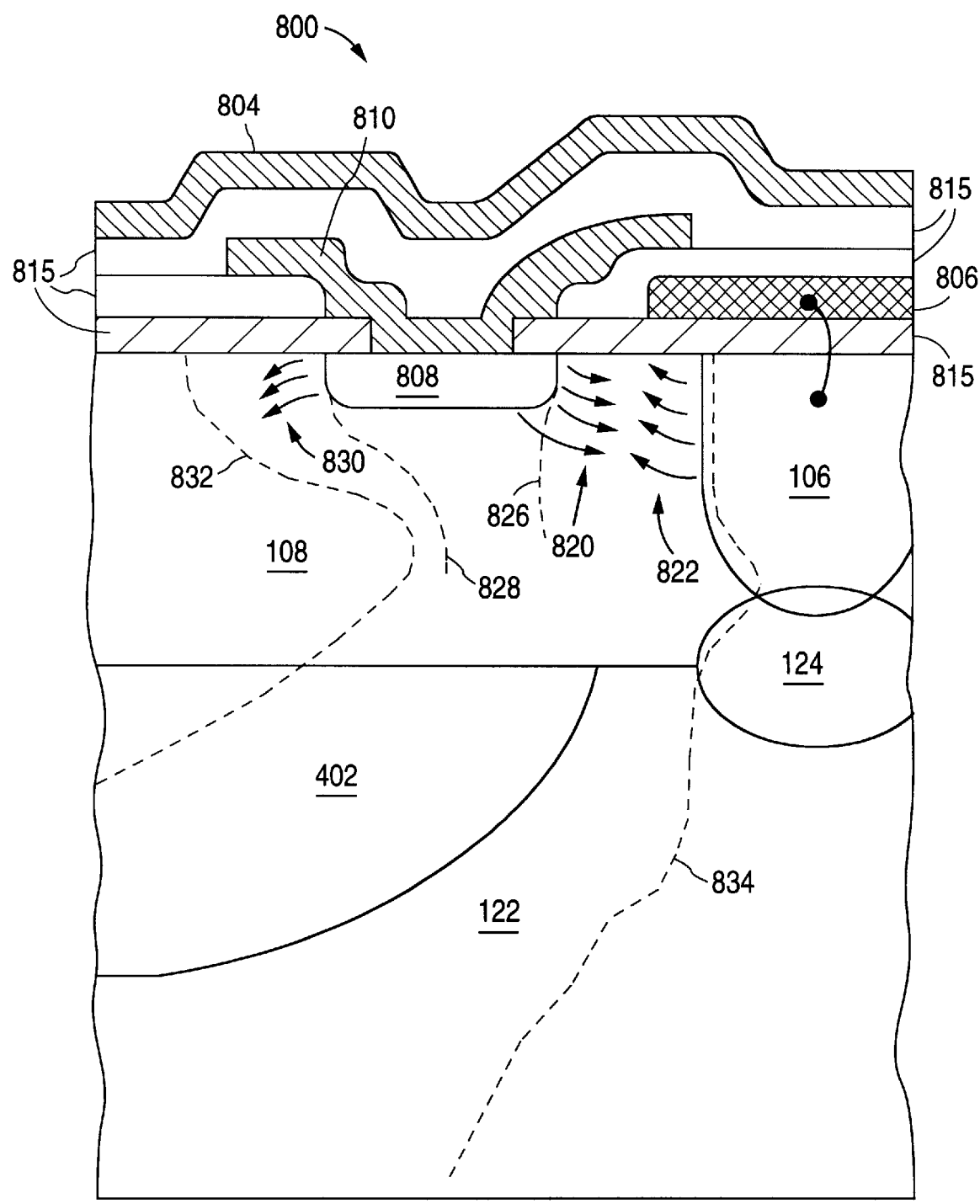
FIG. 10 shows an enlarged view of the device of FIG. 9B wherein a depletion field is defined.

FIG. 10 shows an enlargement of the cross-sectional view of the device 800 shown in FIG. 9B. FIG. 10 will be used to discuss a field limiting arrangement provided by an embodiment of the present invention.

The field limiting arrangement includes the surface ring diffusion 808 and a first structure comprising the metal plate 810 coupled to the ring diffusion 808 and a second structure comprising the poly shield plate 806 coupled to the iso diffusion 106. These two structures effectively divide the total voltage from the metal line and thereby reduce the electric field to a low enough level to prevent breakdown. For example, as the voltage on the epi coupled to metal line 804 increases the depletion regions shown at 820 and 822 increase until they touch and punch through occurs. The depletion boundary is shown at 826. Once punch through occurs, the voltage at the surface diffusion 808 is fixed relative to the iso diffusion region 106, and the depletion boundary moves as shown at 828. As the voltage continues to increase on the metal line 804 the depletion region increases as shown at 830. Eventually, the depletion region can be defined by boundary line 832 in the n-type material and boundary line 834 in the p-type material.

Figure 1A:
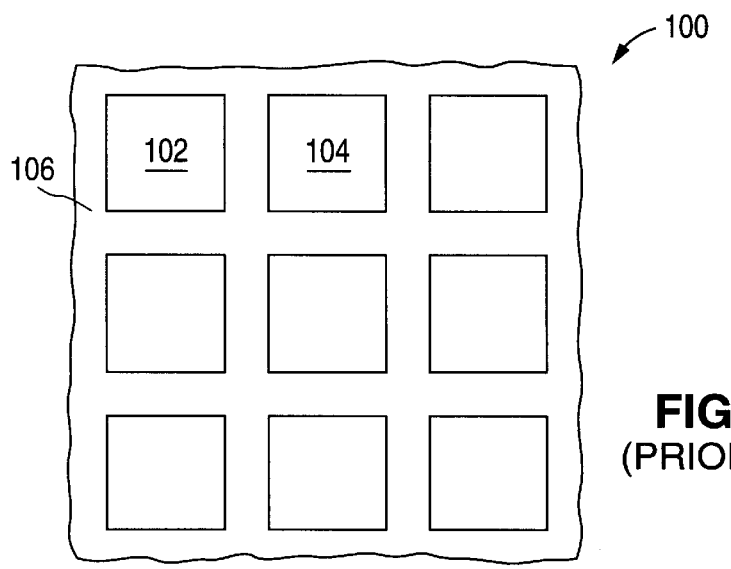
FIG. 1A shows a top view of a typical semiconductor device.
Figure 1B:
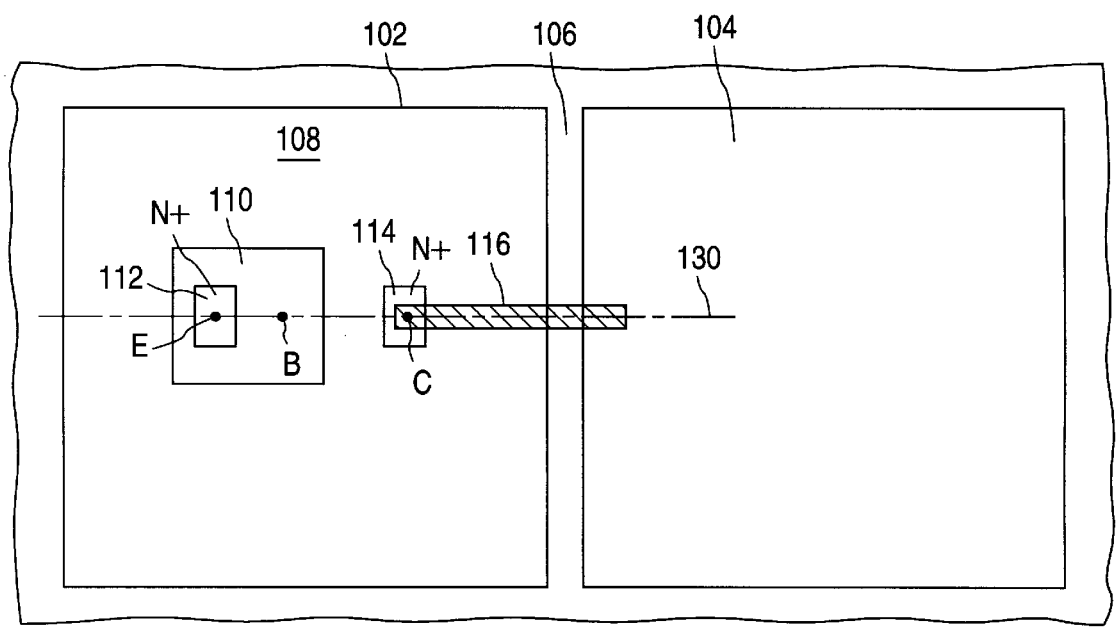
FIG. 1B shows an enlarged top view of the semiconductor device in FIG. 1A.
Figure 1C:
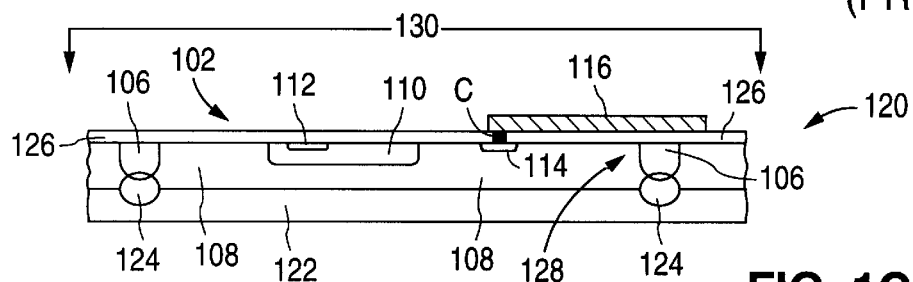
FIG. 1C shows a cross-sectional view of the semiconductor device of FIG. 1B.
Figure 2A:
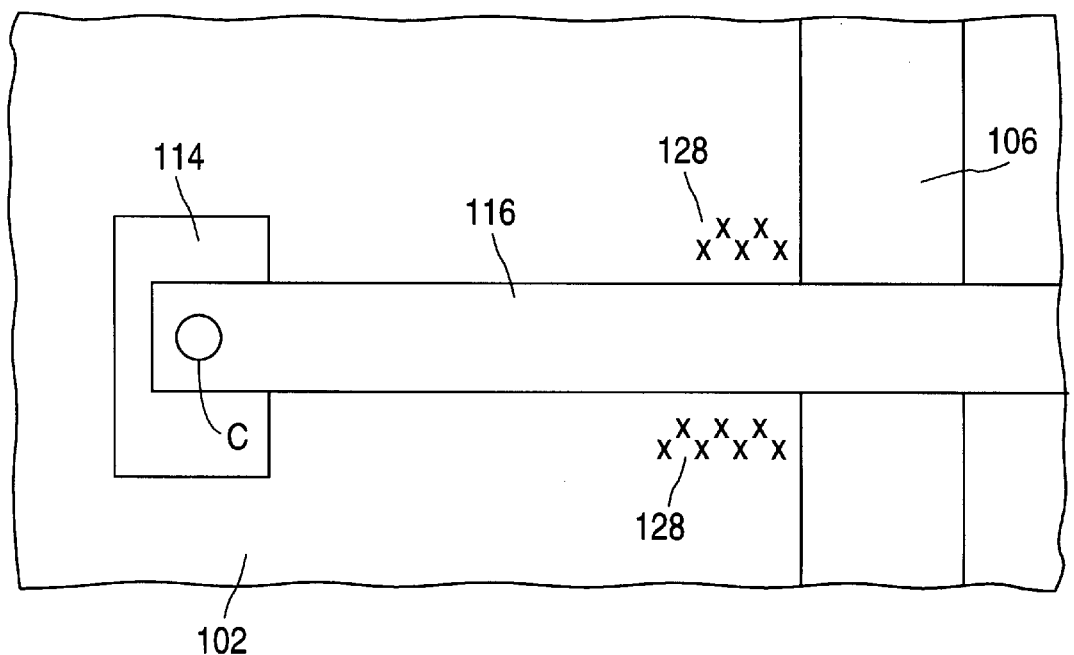
FIG. 2A shows an enlarged top view of the semiconductor device of FIG. 1B.
Figure 2B:
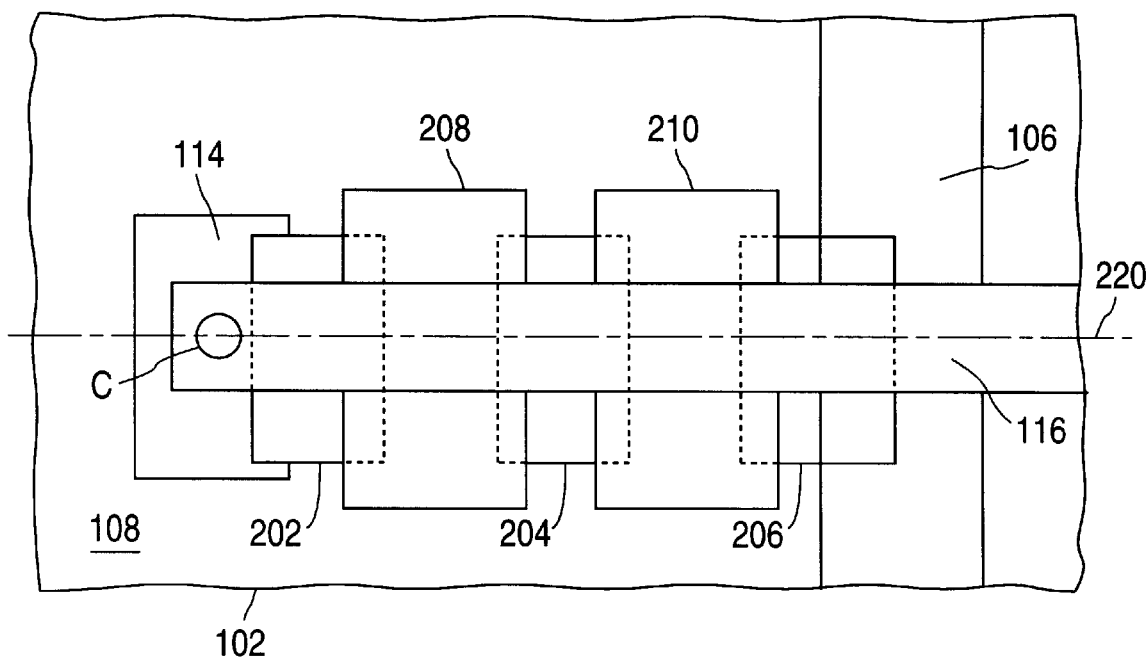
FIG. 2B shows the semiconductor of FIG. 2A including a double poly process used in conjunction with a metal line.
Figure 3:
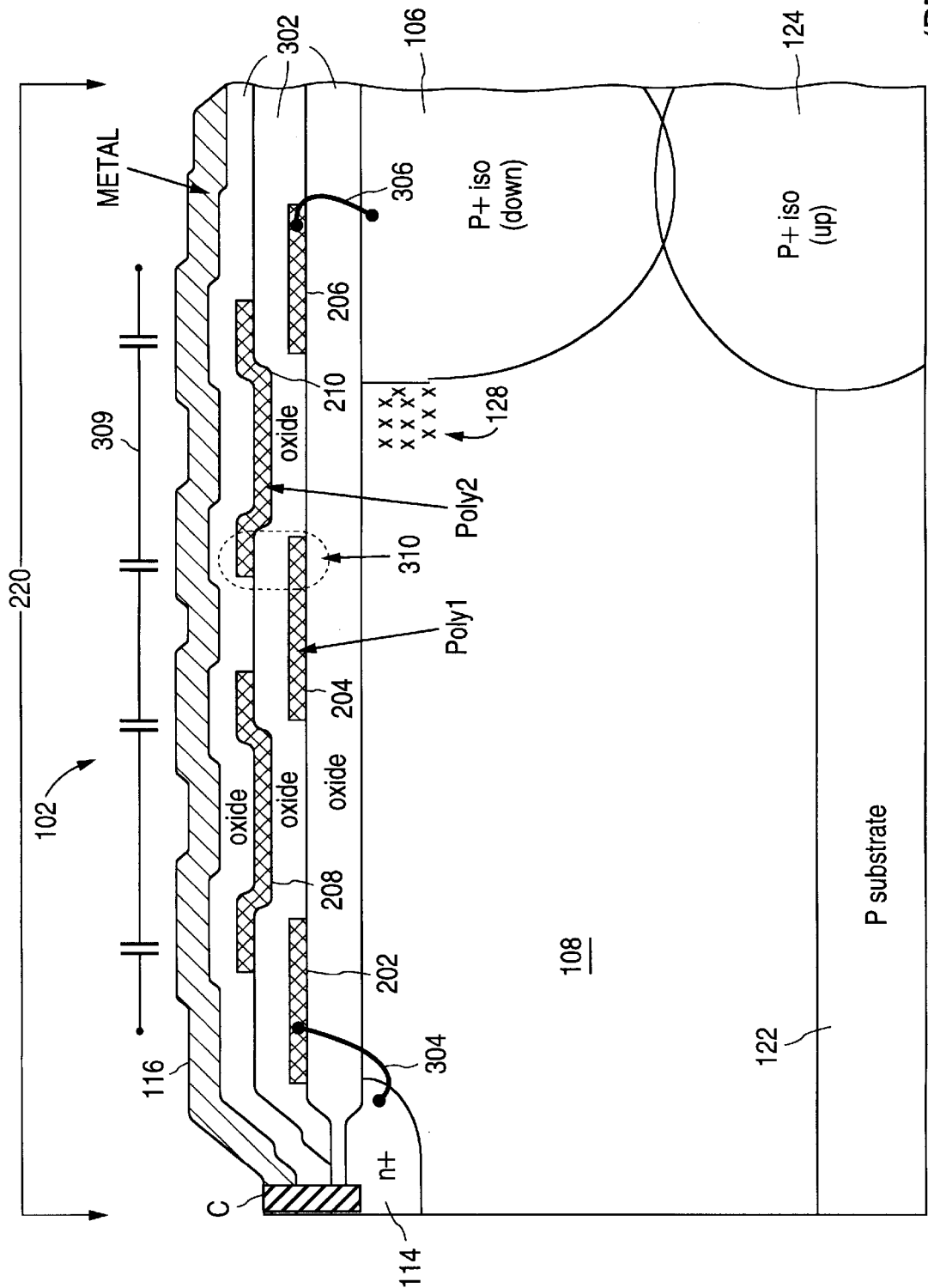
FIG. 3 shows a cross-sectional view of the semiconductor of FIG. 2B.

Therefore, since the voltage at the field limiting ring 808 remains fixed with respect to the iso region 106, breakdown does not occur at the epi 108/iso 106 region as discussed with reference to FIG. 1C.

The use of a single field limiting ring achieves a certain level of field reduction not possible in devices that do not use the field limiting ring. Devices with breakdown voltages up to about 200 V can be made with a single ring.

Figure 11A:
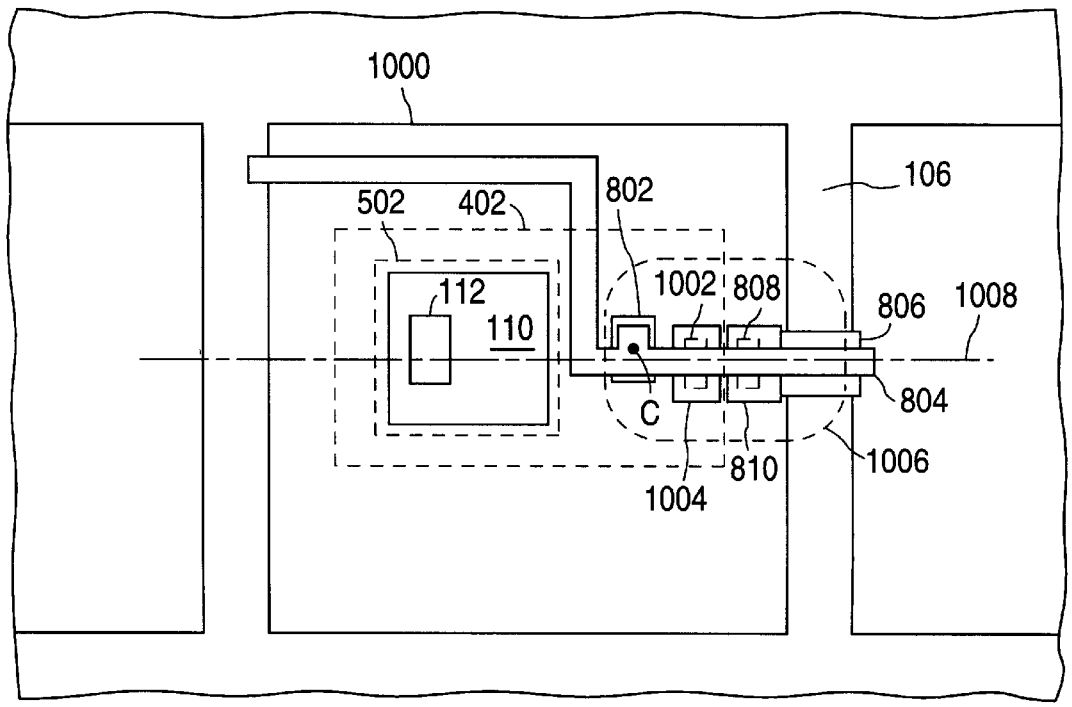
FIG. 11A shows a top view of a device having two surface field limiting rings in accordance with the present invention.

FIG. 11A shows a top view of a device 1000 illustrating another embodiment of the invention wherein multiple field limiting rings are provided to further increase the device breakdown voltage. To implement a device having multiple rings a second diffusion 1002 is provided at a distance to the left of the first diffusion 808. The second diffusion 1002 is coupled to a second metal plate 1004. It is also possible to use a poly material in place of metal plates.

Figure 11B:
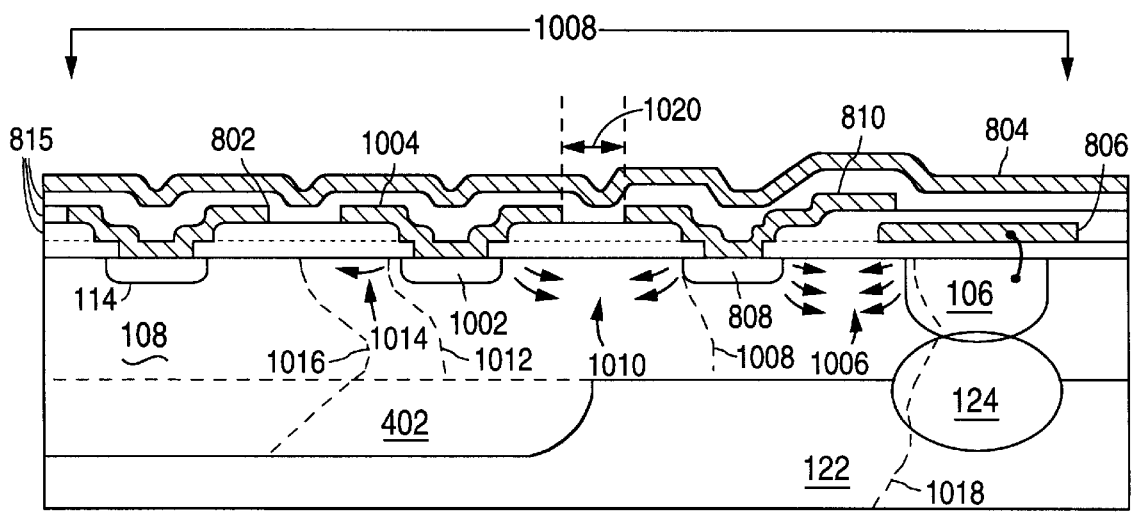
FIG. 11B shows a cross-section view of the device of FIG. 11A wherein a depletion region is defined.

FIG. 11B shows an enlarged cross-sectional view of the portion of the device 1000 shown at 1006, wherein the cross-section is taken at a location indicated by line 1008.

The cross-sectional view of the device 1000 includes the epi layer 108, the n-type collector (or drain) region 114, the p-type substrate 122, and the n-type epi xt diffusion layer 402. The device 1000 of FIG. 11B also includes the ring diffusion 808, the poly field plate 806, the p+ type top iso diffusion 106, the p+ type bottom iso diffusion 124, the metal line 804, the metal contact 802 and the metal plate 810. Also shown in FIG. 11B are the second ring diffusion 1002, the second metal plate 1004, and oxide layers 815 which are used to construct the device 800 in a layered fashion and to insulate conductive elements from direct contact with each other. An exemplary separation distance 1020 between the two contacts is approximately 5–10 microns, while the size of the ring diffusions 1002 and 808 is in the range of 2–10 microns. However, the dimensions may be varied by one with skill in the art dependent on the size and design parameters of the device.

The operation of the device 1000 is similar to the operation of the device 800 as shown in FIG. 10. As the voltage increases on the epi coupled to metal line 804 a depletion region forms as shown at 1006 until punch through occurs between the surface ring 808 and the iso diffusion 106. At this point the boundary of the depletion layer is shown by 1008 and the voltage at the surface diffusion 808 is fixed respective to the iso diffusion 106.

As the voltage continues to increase on the metal line 804, the depletion region continues to grow as shown at 1010 until punch through occurs between the surface ring 1002 and the surface ring 808. At this point the depletion boundary is shown at 1012 and the voltage at the surface diffusion 1002 is fixed with respect to the voltage at the surface diffusion 808.

As the voltage on the epi and metal line 804 increases, the depletion region grows as shown by 1014 and thereby forming the depletion boundary as shown at 1016. Thus the depletion region becomes bounded by the boundary at 1016 and the boundary in the p-type material at 1018.

Using the field limiting surface rings, the electric fields attributed to high voltages on the metal line 804 may be adjusted so that they are distributed over the distance between the collector region 114 and the iso diffusion 106. For example, if the metal line is carrying 600 volts to the collector region 114, the field limiting ring 1002 may have 400 volts, the field limiting ring 808 may have 200 volts and the iso diffusion 106 may have zero volts. Thus, the field limiting rings solve the problems associated with oxide conduction discussed above with reference to the double poly process.

The above improvement of extended epi with buried field and field limiting surface rings can be used together or independently to extend the breakdown voltage of a device. For example, the method described to improve the crossover effect on breakdown voltage, can be used in other high-voltage devices as this method does not rely on any of the attributes of the high-voltage device itself. The field limiting ring type voltage distribution system is independent of oxide leakage or temperature and will work for any duration signal, including DC, as the voltage is determined by punch through and this only depends on epi resistivity and device geometry. Therefore, using the field limiting ring overcomes the problems associated with the capacitor voltage divider circuit shown in FIG. 1. In another embodiment of the invention for use in the case of very high voltages (800V and higher), the space over the epi region 108 between the base/body diffusion 110 and the iso diffusion 106 can be filled with field limiting rings to prevent high fields from causing breakdown in the path of the cross over. For example, if the voltage is at the collector 114 is at 1600V, then more rings, such as 6 to 8 rings may be necessary.

The present invention provides a method and apparatus for fabricating high voltage and low voltage devices on a single semiconductor substrate. It will be apparent to those with skill in the art that modifications to the above methods and embodiments can occur without deviating from the scope of the present invention. Accordingly, the disclosures and descriptions herein are intended to be illustrative, but not limiting, of the scope of the invention which is set forth in the following claims along with their full scope of equivalents.

What is claimed is:

1. A semiconductor device constructed on a semiconductor substrate including an isolation diffusion region around the semiconductor device, a substrate layer, an epi layer on top of the substrate layer, a surface diffusion region extending into the epi layer from a top surface of the epi layer and a metallization line coupled to the surface diffusion, wherein the metallization line traverses the semiconductor device and the isolation diffusion region, the semiconductor device comprising:

a poly field plate over the isolation diffusion region and beneath the metallization line;

a field limiting diffusion region in the epi layer between the surface diffusion region and the isolation diffusion region, and below the metallization line; and a contact coupled to the field limiting diffusion region, wherein the contact extends to a region below the metallization line and overlapping the poly field plate.

2. The semiconductor device of claim 1 further comprising an extended epi region extending into the substrate layer below the surface diffusion region.

3. The semiconductor device of claim 2 further comprising a buried field region located below the surface diffusion region and in the epi layer.

4. The semiconductor device of claim 3 wherein the buried field region has tapered edges.

5. The semiconductor device of claim 1 wherein the field limiting diffusion region is a first field limiting diffusion region and the contact is a first contact, the semiconductor device further comprising:

a second field limiting diffusion region in the epi layer between the surface diffusion region and the first field limiting diffusion region, and below the metallization line; and a second contact coupled to the second field limiting diffusion region, the second contact extending to a region below the metallization line in close proximity to the first contact.

6. In a semiconductor device including a substrate layer, an epi layer on top of the substrate layer, and a base diffusion region extending into the epi layer from a top surface of the epi layer, an improvement comprising:

an extended epi layer located below the base diffusion region and extending into a portion of the substrate layer; and a buried field region in the epi layer at a location below the base diffusion region.

7. The improvement of claim 6 wherein the buried field region has tapered edges.

8. A method for increasing the breakdown voltage of a semiconductor device, the semiconductor device including a substrate layer, an epi layer on top of the substrate layer, and a base diffusion region extending into the epi layer from a top surface of the epi layer, the method comprising:

extending the epi layer located below the base diffusion region into a portion of the substrate layer; and inserting a buried field region in the epi layer at a location below the base diffusion region.

9. A method of claim 8 further including a step of tapering the edges of the buried field layer.

10. A method for increasing the breakdown voltage of a semiconductor device, the semiconductor device constructed on a semiconductor substrate including an isolation diffusion region around the semiconductor device, a substrate layer, an epi layer on top of the substrate layer, a surface diffusion region extending into the epi layer from a top surface of the epi layer and a metallization line coupled to the surface diffusion, wherein the metallization line traverses the semiconductor device and the isolation diffusion region, the method comprising:

inserting a poly field plate over isolation diffusion region and beneath the metallization line;

inserting a field limiting diffusion region in the epi layer between the surface diffusion region and the isolation diffusion region, wherein the field limiting diffusion region is located below the metallization line; and coupling a contact to the field limiting diffusion region, wherein the contact extends to a region below the metallization line and overlapping the poly field plate.

11. The method of claim 10 further comprising a step of extending the epi region into the substrate layer below the surface diffusion region.

12. The method of claim 10 further comprising a step of burying a buried field region below the surface diffusion region and in the epi layer.

13. The method of claim 12 further comprising a step of tapering the edges of the buried field region.

14. The method of claim 10 wherein the field limiting diffusion region is a first field limiting diffusion region and the contact is a first contact, and the method further comprises steps of:

inserting a second field limiting diffusion region in the epi layer between the surface diffusion region and the first field limiting diffusion region, and below the metallization line; and coupling a second contact to the second field limiting diffusion region, the second contact extending to a region below the metallization line in close proximity to the first contact.

* * * * *